(12) United States Patent
Kalnitsky et al.

(10) Patent No.: US 7,522,753 B2
(45) Date of Patent: *Apr. 21, 2009

(54) ELECTROSTATIC DISCHARGE PROTECTION OF A CAPACITIVE TYPE FINGERPRINT SENSING ARRAY

(75) Inventors: Alexander Kalnitsky, San Francisco, CA (US); Alan Kramer, Berkeley, CA (US)

(73) Assignee: UPEK, Inc., Emeryville, CA (US)

( * ) Notice: Subject to any disclaimer, the term of this patent is extended or adjusted under 35 U.S.C. 154(b) by 509 days.

This patent is subject to a terminal disclaimer.

(21) Appl. No.: 11/162,861

(22) Filed: Sep. 27, 2005

(65) Prior Publication Data
US 2006/0011997 A1 Jan. 19, 2006

Related U.S. Application Data

(60) Division of application No. 10/253,841, filed on Sep. 23, 2002, now Pat. No. 6,987,871, which is a continuation of application No. 08/927,450, filed on Sep. 11, 1997, now Pat. No. 6,483,931.

(51) Int. Cl.
*G06K 9/00* (2006.01)

(52) U.S. Cl. .................. 382/124; 382/125; 382/126; 382/127; 382/312

(58) Field of Classification Search ............. 382/124, 382/125, 126, 127, 312, 313; 324/661, 662, 324/663, 658

See application file for complete search history.

(56) References Cited

U.S. PATENT DOCUMENTS

| | | | |
|---|---|---|---|
| 3,493,855 A * | 2/1970 | Norwich | 324/664 |
| 3,641,431 A * | 2/1972 | Pigage et al. | 324/662 |
| 3,781,855 A * | 12/1973 | Killen | 382/126 |
| 3,873,927 A * | 3/1975 | Overall | 307/650 |

* cited by examiner

*Primary Examiner*—Brian Q Le
(74) *Attorney, Agent, or Firm*—Jonathan A. Small

(57) ABSTRACT

A planar fingerprint pattern detecting array includes a large number of individual skin-distance sensing cells that are arranged in a row/column configuration. Each sensing cell includes an amplifier having an ungrounded input mode and an ungrounded output node. Output-to-input negative feedback that is sensitive to the fingerprint pattern is provided for each amplifier by way of (1) a first capacitor plate that is placed vertically under the upper surface of a dielectric layer and is connected to the ungrounded amplifier input node, (2) a second capacitor plate that is placed vertically under the upper surface of the dielectric layer in close horizontal spatial relation to the first capacitor plate and is connected to the ungrounded output node, and (3) an ungrounded fingertip whose fingerprint pattern is to be detected, which ungrounded fingertip is placed on the upper surface of the dielectric layer in close vertical spatial relation with the first and second capacitor plates. Electrostatic discharge protection relative to electrostatic potential that may be carried by the ungrounded fingertip is provided by placing a number of grounded metal paths within the dielectric layer to spatially surround each of the first and second capacitor plates, this being done in a manner that does not disturb the ungrounded state of the fingertip.

6 Claims, 3 Drawing Sheets

ELECTROSTATIC DISCHARGE PROTECTION OF A CAPACITIVE TYPE FINGERPRINT SENSING ARRAY

PRIORITY

This application is a Divisional of U.S. patent application Ser. No. 10/253,841, filed Sep. 23, 2002, and entitled Electrostatic Discharge Protection of a Capacitive Type Fingerprint Sensing Array, and which is a Continuation of U.S. patent application Ser. No. 08/927,450, filed on Sep. 11, 1997, now U.S. Pat. No. 6,483,931.

CROSS REFERENCE TO RELATED APPLICATIONS

U.S. patent application Ser. No. 08/799,548, filed Feb. 13, 1997, and entitled CAPACITIVE DISTANCE SENSOR, shows a type of distance sensor that can be used in fingerprinting, and with which the present invention finds utility, and this related patent application is incorporated herein by reference.

U.S. Pat. No. 6,011,859, entitled SOLID STATE FINGERPRINT SENSOR PACKAGING APPARATUS AND METHOD, shows a type of capacitive fingerprint sensing packaging apparatus/method with which the present invention finds utility, and this related patent application is incorporated herein by reference.

BACKGROUND OF THE INVENTION

1. Field of the Invention

This invention relates to the field of fingerprint image sensing and detection; i.e., to the detection of a fingerprint's minutiae such as ridge endings and bifurcations. More specifically, this invention relates to a multi-pixel, capacitance type fingerprint sensor.

2. Description of the Related Art

As is well known, the fingerprint of a human is composed of lines or ridges, which have both branching parts or bifurcations and abrupt endings or end points. These branching parts, bifurcations, endings, and end points are also known as minutiae. Fingerprints are identified by the locations of, and the relationships among, these minutiae.

The present invention relates to an improved capacitance sensor that operates to sense or detect fingerprint minutiae. The use of capacitance type sensors is generally known.

For example, the publication SENSORS AND ACTUATORS, January/February 1989, no. 1/2, at pages 141-153, contains an article entitled INTEGRATED TACTILE IMAGER WITH AN INTRINSIC CONTOUR DETECTION OPTION that was presented at the Fourth International Conference on Solid-State Sensors and Actuators (Transducers '87), Tokyo, Japan, Jun. 2-5, 1987. This article describes an integrated capacitive tactile imaging sensor that comprises a multi-layer construction having a bottom ceramic support, a 9row/9-column array of square aluminum electrodes that are contained on a silicon wafer integrated circuit, a flexible and isolating intermediate layer that is made up of natural rubber, a thin conductive rubber layer, and a top protective layer. In this device, capacitance depends upon local deformation of the natural rubber layer. The 81 individual aluminum electrodes of this device provide capacitive measurement of an indentation pattern within the natural rubber layer, this indentation being caused by a pressure distribution that acts on the top protective layer.

The use of a capacitance type sensor to sense the minutiae of a human fingerprint is also known.

For example, the publication IEEE ELECTRON DEVICE LETTERS, VOL. 18, NO. 1, JANUARY 1997, pages 19-20, contains an article entitled NOVEL FINGERPRINT SCANNING ARRAYS USING POLYSILICON TFT'S OF GLASS AND POLYMER SUBSTRATES. This article describes a two-dimensional (2-D), 200.times.200, capacitance sensing array that is made up of 40,000 individual pixels. Each pixel of the array includes two thin film transistors (TFTs) and a capacitor plate. Each array pixel resides at the intersection of an array-row and an array-column, and each array pixel is individually addressable by way of row-driver circuits and column-driver circuits.

Considering the two TFTs, hereinafter called TFT-A and TFT-B, that are associated with a given pixel, the drain electrodes of TFT-A and TFT-B are connected to the pixel's capacitor plate, the gate electrode and the source electrode of TFT-A are connected to a row-conductor that is associated with the pixel, the gate of TFT-B is connected to the following row-conductor, and the source of TFT-B is connected to a column-conductor that is associated with the pixel.

A thin (0.1 micrometer) silicon nitride insulator overlies the capacitor plate of each array pixel. When the ridge of a fingerprint lies directly over the capacitor plate, a capacitor is formed between the capacitor plate and the finger. This capacitor is charged when a row-pulse (8 to 10 VDC, and of 10 to 100 micro second duration) is applied to the pixel by way of the row-conductor that is associated with this pixel and TFT-A. This stored charge is thereafter transferred onto the pixel's column-conductor through TFT-B when a row-pulse is applied to the following row-electrode.

Also of interest is the publication 1997 IEEE INTERNATIONAL SOLID-STATE CIRCUITS CONFERENCE that contains an article beginning page 200 entitled A 390DPI LIVE FINGERPRINT IMAGER BASED ON FEEDBACK CAPACITIVE SENSING SCHEME. This article describes a single-chip, 200.times.200 element array, 2-metal digital CMOS technology, sensor that is based upon feedback capacitance sensing, and that operates to detect the electrical field variation that is induced by the finger's skin surface. In each element of the array, two horizontally spaced metal plates are separated from the overlying and adjacent portion of the finger's skin surface by passivation oxide. Since the distance between the skin and the sensor's surface identifies the presence of the fingerprint's ridges and valleys, an array of elements provides a complete fingerprint pattern.

In each element of the array, the two metal plates are respectively connected to the input and the output of a high-gain inverter, to thereby form a charge-integrator. In operation, the charge-integrator is first reset by shorting the input and output of the inverter. A fixed amount of charge is then sinked from the input, causing the output voltage to swing inversely proportional to a feedback capacitance value that is inversely proportional to the distance to the fingerprint's ridges and valleys. The array of cells, or sensors, thus provides the complete fingerprint pattern. The fingerprint image disappears when the finger is removed from the array.

U.S. Pat. No. 4,353,056, incorporated herein by reference, is of interest in that it relates to a capacitance type fingerprint sensor wherein a finger is pressed onto the sensor's surface in order to read the ridges and valleys of the fingerprint. The sensor-surface has a large number of capacitors of a small physical size associated therewith. Two sensors are described. In a first type of sensor, an electrical insulator carries a number of flexible and horizontally spaced curved metal electrodes, two adjacent metal electrodes of which comprise one capacitor. A protective insulating film overlies the electrical insulator, and when a finger is brought into physical contact with this protective insulating film, the metal electrodes are physically deformed, thereby selectively changing the capacitance of the large number of capacitors in accordance with the fingerprint's ridge/valley pattern. In a second type of sensor, the top surface of a rigid support carries a number of horizontally spaced and flat metal electrodes in a fixed position. Placed above the plane of the metal electrodes is the sequential arrangement of a flexible insulator, a flexible electrode, and a flexible protective membrane. A capacitor is formed between the top flexible electrode and each of the lower and fixed-position flat metal electrodes. When the end of a finger is brought into contact with the flexible membrane, the flexible electrode becomes wavy in accordance with the fingerprints' ridges/valleys pattern.

In addition, U.S. Pat. No. 5,325,442, incorporated herein by reference, relates to a capacitance type fingerprint sensor having a sensing pad that comprises a planar array of row/column sensing elements having a pitch of about 100 micrometers. Each sensing element is located at the intersection of a row conductor and a column conductor. A plurality of these sensing elements make up an array of regularly spaced, and relatively equal, size rectangles.

Each sensing element of this patent includes a first ungrounded, physically buried, and planar metal capacitor plate that is dielectric-spaced from an electrically grounded finger surface that forms a second capacitor plate, as shown in the circuit of this patent's FIG. 2. In FIGS. 7a-7b of this patent, the finger-engaging surface includes exposed and grounded metal film conductors 53 that physically engage the finger to ensure operation of the FIG. 2 circuit by reliably grounding the finger, to thereby reliably ground the above-described second capacitor plate.

The sensing elements are fabricated using photolithographic processes, and each individual sensing element includes a Thin-Film-Transistor (TFT) in the form of a Field-Effect-Transistor (FET). Each FET gate is connected to a row conductor, each FET source is connected to a column conductor, and each FET drain is connected to a sensing electrode.

In one embodiment, each sensing element comprises a sensing capacitor that is formed between a sensing electrode and the finger. In another embodiment, each sensing element includes an electrically isolated and conducting pad that is physically engaged and electrically grounded by the finger.

While prior devices, as above described, are generally useful for their limited intended use, a need remains in the art for a capacitance type fingerprint sensor wherein the fingerprint pattern of an ungrounded fingertip is sensed, and wherein the construction and arrangement of the sensor minimizes, or prevents, an electrostatic charge that may be carried by a human body from disturbing the operation of a capacitance type fingerprint sensor.

SUMMARY OF THE INVENTION

As is well known, a capacitive sensor array of the general type that finds utility in fingerprint pattern recognition/detection systems includes a generally planar array of many row/column arranged and individual capacitive sensing cells, wherein each individual sensing cell comprises one pixel of the array.

In a type of sensor array with which this invention finds utility, each sensing cell generally includes one or more generally topmost-level, dielectric-covered, and ungrounded metal capacitor plates. An ungrounded fingertip that forms another capacitor plate is placed on the top dielectric surface of the array, and cells that are physically contacted by a fingerprint ridge experience increased capacitance, as compared to those cells that are spaced a short distance below a fingerprint valley.

The present invention finds utility with a construction and arrangement wherein each such cell includes an amplifier circuit whose output/input are feedback-interconnected by a compound-capacitor circuit that is made up of the ungrounded one or more generally topmost-level and dielectric-covered metal capacitor plates, and the ungrounded fingertip that forms another capacitor plate.

In this particular type of ungrounded output/input feedback circuit configuration, the electrostatic charge that is sometimes carried by a human body may be sufficiently high to break through the sensor's upper-most passivation layer or dielectric layer that covers all cells, and/or to exceed the gate oxide breakdown voltage of a sensing circuit that is connected to the one or more dielectric-covered metal capacitor plates.

The present invention improves the electrostatic discharge (ESD) performance of such a capacitive sensor array by physically surrounding, but not physically contacting, each individual dielectric-covered capacitor plate with a metal-grid-work, metal-mesh-lines, or a metal-pattern, that is connected directly to system ground potential.

Examples of such a grounded metal-pattern include, but are not limited to, a metal-pattern that occupies generally the same horizontal plane as the capacitor plate(s) to be protected from electrostatic charge, a metal-pattern that occupies a generally horizontal plane that is located vertically above the horizontal plane occupied by the capacitor plate(s) to be protected from electrostatic charge, a metal-pattern that occupies a generally horizontal plane that is located vertically below the horizontal plane occupied by the capacitor plate(s) to be protected from electrostatic charge, and a metal-pattern that occupies a horizontal plane that is located vertically below the horizontal plane occupied by the capacitor plate(s) to be protected from electrostatic charge and includes a plurality of metal fingers that extend vertically upward to generally surround the capacitor plate(s). In the spirit of this latter example, grounded metal-patterns within the spirit and scope of this invention need not be physically continuous grounded metal-patterns.

In accordance with this invention, the grounded ESD protecting metal grid/mesh/pattern may be placed in the same physical dielectric-covered level, or plane, as the above-described one or more metal capacitor plates, or the grounded ESD protecting grid/mesh/pattern may be placed on a somewhat higher physical and dielectric-covered level. It is critical to this invention that the grounded ESD protective grid/mesh/pattern of this invention be physically and electrically isolated from the upper dielectric surface that the fingertip touches. In this way, the fingertip is not undesirably grounded by physical contact with this upper dielectric surface. Grounding of the fingertip is undesirably in this type of capacitance sensing array since a grounded fingertip would also ground a portion of the amplifier's output/input feedback circuit, thus rendering the amplifier essentially inoperative.

The present invention finds particular utility when the grounded protective grid thereof is provided as a portion of a solid state capacitive sensor for a fingerprint recognition system that includes a periodic array of integrated circuits (ICs) and dielectric-buried capacitor plates; for example, wherein each array pixel includes a signal-inverting circuit whose output and input are respectively connected to one of a pair of generally topmost disposed, dielectric-buried, and generally coplanar metal capacitor plates. In this construction and arrangement, the fingertip that is being subjected to fingerprint pattern sensing/recognition is physically placed on, or very closely adjacent to, a top-most disposed dielectric or passivated surface of the solid state sensing structure. The presence of an ungrounded fingertip skin ridge across a cell's pair of dielectric-buried coplanar metal plates operates to induce capacitive coupling between the pair of capacitor plates, relative to, for example, ad an adjacent cell whose buried capacitor plates cooperate with an ungrounded fingertip skin valley. The entire fingerprint pattern can thus be digitized by sensing the differences in adjacent cell capacitive values.

The ESD immunity of such a solid state array may be relatively poor, since in this type of circuit configuration, it is usual to connect the cell's buried and ungrounded capacitor plates to transistor gates and/or to connect the cell's ungrounded and buried capacitor plates to system ground potential by way of reverse biased diodes. In this type of construction and arrangement, the electrostatic charge sometimes carried by a human body and its fingertip, which may be in the range of several kilo volts (kV), may be sufficiently high to break through the solid state cell's upper dielectric/passivation layer, and thus raise the potential at ungrounded circuit nodes that are associated with the buried capacitor plates so as to exceed the gate oxide breakdown voltage of the transistor gates that are connected to these capacitor plates. In addition, if the fingertip's electrostatic induced voltage buildup across the above mentioned ground connecting diodes exceeds the oxide breakdown voltage, the gate oxide can be ruptured, thus damaging the associated array cell.

In order to improve the ESD immunity of such a solid state array, the present invention operates to surround each capacitor plate with a grid, or mesh of metal lines, that are connected directly to system ground potential. In accordance with this invention, this new and unusual grounded grid/mesh of metal lines may be placed, buried, or routed in the same horizontal plane as that occupied by the capacitor plates, or the grid/mesh of metal lines may be placed, buried, or routed in a higher horizontal plane than the plane occupied by the buried capacitor plates. In this second case, the grid/mesh of metal lines occupies a plane that is physically closer to, but remains dielectric-isolated from, the fingertip than is the plane of the buried capacitor plates.

An object of this invention is to provide electrostatic discharge protection for a capacitive type fingerprint pattern sensing array that has a number of individual skin-distance sensing cells that are arranged in a closely spaced physical configuration, wherein the array includes a dielectric layer having an upper surface on which an ungrounded fingertip having a fingerprint pattern is placed. Each sensing cell includes an amplifier having an ungrounded input mode, an ungrounded output node, and ungrounded output-mode-to-input-node negative feedback circuit. This negative feedback circuit includes the capacitive effect of a fingertip of the upper surface of the dielectric layer, and this negative feedback is therefore sensitive to the fingertip's unique fingerprint pattern. More specifically, this negative feedback is provided by the series electric effect of (1) a first capacitor plate that is located or buried vertically under the upper surface of the dielectric layer and connected to the ungrounded input node, (2) a second capacitor plate that is located, or buried, vertically under the upper surface of the dielectric layer in close horizontal spatial relation to the first capacitor plate and connected to the ungrounded output node, and (3) the ungrounded fingertip that is placed in vertical spatial relation with the first and second capacitor plates. Continuous, or discontinuous, grounded metal paths are now provided vertically under the upper surface of the dielectric layer, or buried within the dielectric layer, to thereby spatially surround the first and second capacitor plates in an electrical sense. This metal path is connected to ground potential, to thereby protect the input and output nodes from electrostatic potential that may be carried by the fingertip, and in a manner that does not disturb the ungrounded state of the fingertip.

These and other objects, features and advantages of this invention will be apparent to those of skill in the art upon reference to the following detailed description of preferred embodiments thereof, which description makes reference to the drawing.

DESCRIPTION OF THE PREFERRED EMBODIMENT

Figure 1:
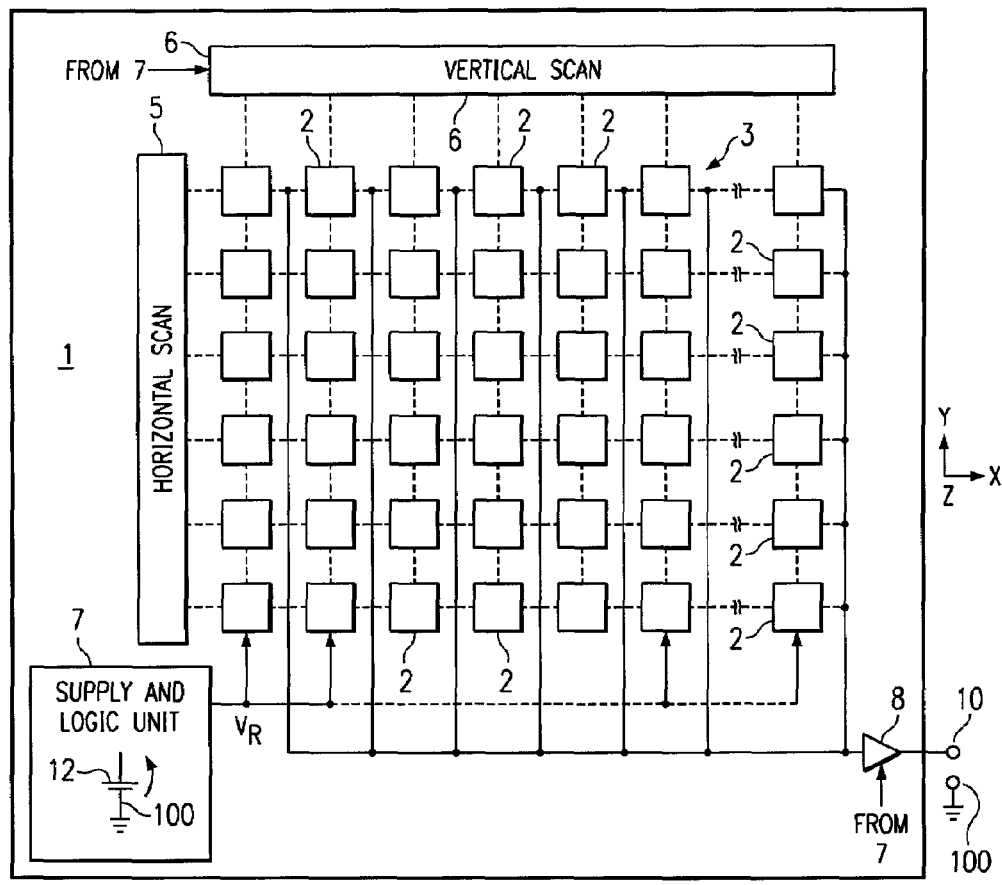
FIGS. 1, 2 and 3 are related to above-mentioned U.S. patent application Ser. No. 08/799,548, filed Feb. 13, 1997, and entitled CAPACITIVE DISTANCE SENSOR. The sensing-array of FIG. 1 includes a large number of the individual FIGS. 2,3 sensing-cells and can be used in fingerprinting. The present invention's ESD protecting apparatus/method finds utility within each cell of the FIG. 1 sensing-array.
Figure 2:
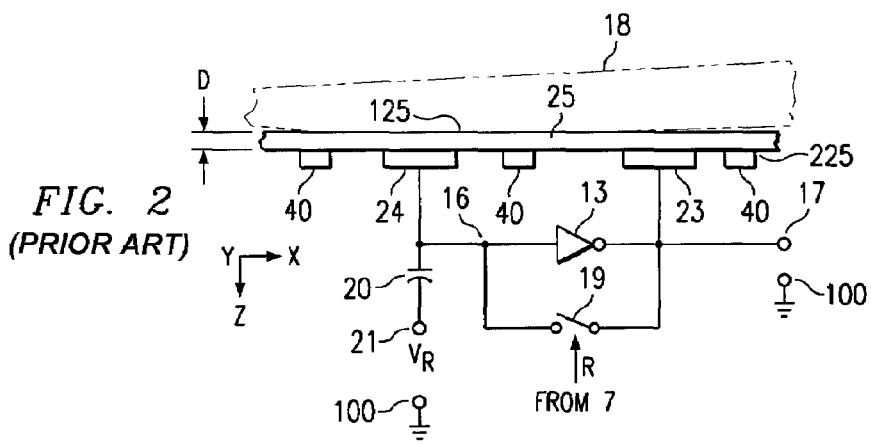
Figure 3:
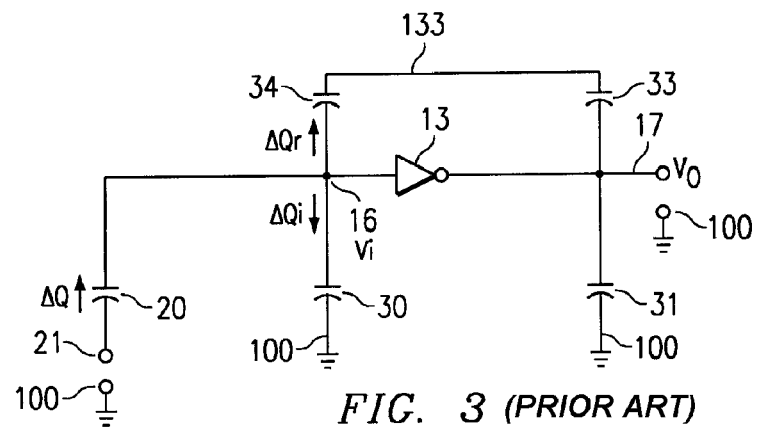

FIGS. 1, 2 and 3 are related to above-mentioned U.S. patent application Ser. No. 08/799,548, filed Feb. 13, 1997, and entitled CAPACITIVE DISTANCE SENSOR. FIGS. 2 and 3 show one of FIG. 1's sensing cell 2, each cell operating to measure or determine the distance "d" to a vertically-associated part of a fingertip 18. Array 3 of FIG. 1 includes a large number of FIG. 2's individual sensing cells 2 and can be used in fingerprinting. The present invention's ESD protecting apparatus/method finds utility within each cell 2 of array 3.

FIG. 1, which is taken in the X-Y plane, is a top view of an integrated circuit (IC) device 1 that includes a generally planar, multiple pixel, multiple row/column, sensor-array 3 having a relatively large number of the FIG. 2 individual solid state capacitive sensor cells 2. Cells 2 operate in combination to provide a time-sequential electrical output 10 that comprises the multiple pixel fingerprint pattern of an ungrounded fingertip 18 that is placed on the dielectric upper surface 125 of array 3.

Array 3 contains the number N of horizontal or X-direction extending rows of individual capacitance sensor cells 2, each row having the number M of individual sensor cells 2 therein, and array 3 contains the number M of vertical or Y-direction extending columns of individual capacitance sensor cells 2, each column having the number N of individual sensor cells 2 therein. The numbers N and M are integers that may of may not be equal to each other. The number of individual picture elements, pixels, or cells 2 within array 3 is quite large, and equals the product of M.times.N. An example is 512.times.512 pixels or cells 2 within array 3, array 3 being of a physical size of about 20 mm to about 25 mm.

Each individual cell 2 within array 3 is addressable by virtue of the cell being physically located at the intersection of a horizontal row and a vertical column within array 3. The manner in which the individual sensor cells 2 of array 3 are addressed and readout in order to digitize a multiple pixel fingerprint pattern are well known to those of skill in the art and do not form a limitation on this invention.

IC device 1 includes a horizontal scanning stage, or network 6, and a vertical scanning stage or network 5 for sequentially interrogating or reading one cell 2 at a time, according to a predetermined cell-scanning pattern. Preferably, stages 5 and 6 comprise shift registers or decoders that operate to interrogate the outputs 17 of cells 2 sequentially.

Figure 4:
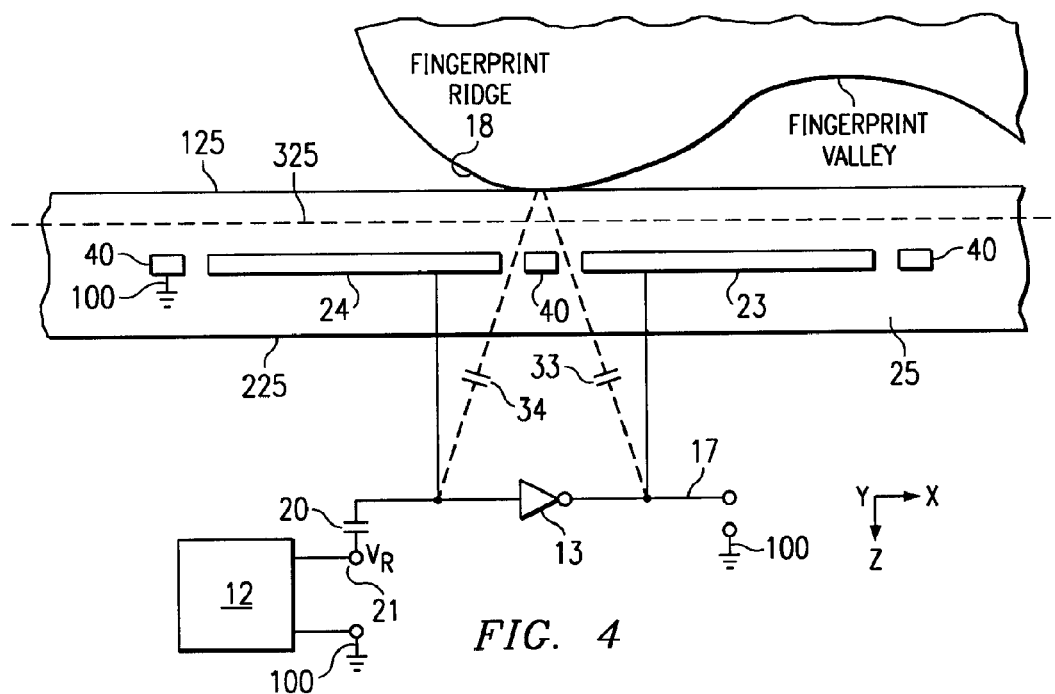
FIG. 4 is a side view of one sensing cell of the ungrounded-feedback type shown in FIG. 2, FIG. 4 showing the manner in which the cell's two capacitor plates are located on a common horizontal plane and buried within the body of a dielectric layer whose top surface is adapted for physically engagement by a fingerprint ridge, FIG. 4 showing a grounded metal grid of the present invention that operates to protect the ungrounded capacitor plates from electrostatic potential that may be carried by the ungrounded fingertip, and FIG. 4 showing an embodiment of the invention wherein the grounded metal-grid or pattern occupies generally the same horizontal plane as the capacitor plate(s) to be protected from electrostatic charge.
Figure 5:
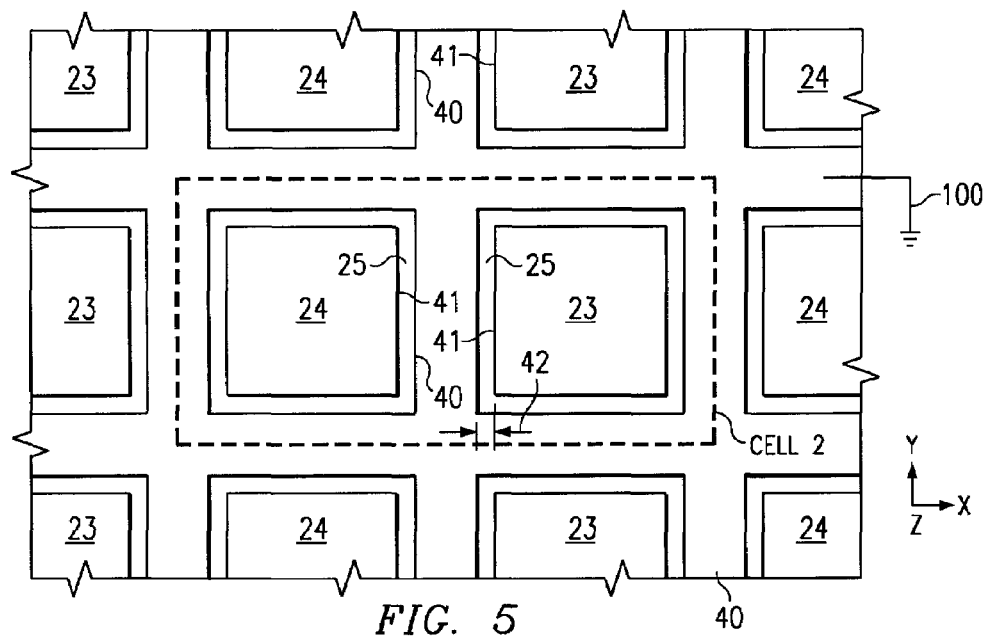
FIG. 5 is a top view of the two capacitor plates of the sensing cell of FIG. 4 and a portion of the capacitor plates of adjacent sensing cells, FIG. 5 better showing the geometric form and shape of the grounded metal grid, and the manner in which this metal grid surrounds all capacitor plates of all sensing cells.

The present invention deals with a grounded metal grid, or mesh, construction and arrangement 40 that is electrically isolated from, but physically associated with, the dielectric-covered, or dielectric-buried, capacitor plates 23 and 24 of FIGS. 2, 4 and 5.

It is important to this invention that this electrically grounded grid/mesh 40 be physically and electrically isolated from the upper surface 125 of dielectric layer 25 upon which the ungrounded fingertip 18 is placed. Grounded metal grid/mesh 40 operates to protect the many individual ungrounded electrical modes, such as nodes 16,17, from any electrostatic potential that may be carried by a person whose fingerprint is to be sensed or detected by way of placing finger or fingertip portion 18 physically on the top surface 125 of FIG. 2's dielectric layer 25.

IC device 1 includes a grounded supply/logic stage, or network, 7 that operates to supply the components of IC device 1, including all cells 2, with the necessary operating voltages, and to control the sequence of steps that are necessary for operation of IC device 1. In particular, a grounded DC voltage source 12 provides a DC reference voltage Vr. A buffer 8 is connected to the outputs 17 of all cells 2. The output 10 of buffer 8 is referenced to system ground 100 and comprises the output of IC device 1, the serial signal sequence at output 10 being controlled by operation of scanning stages 5 and 6.

FIG. 2 schematically shows the circuit details of a single cell 2 of FIG. 1's array 3, all cells 2 being generally identical in construction and arrangement. Each cell 2 includes a low-power, signal-inverting, amplifier 13 having an exemplary gain of from about 1000 to about 2000. Terminal 21 and system ground 100 comprise the ground-referenced input to the circuit of FIG. 2, and terminal 21 and input capacitor 20 connect to input 16 of amplifier 13. Terminal 17 and system ground 100 comprises the ground-referenced output of cell 2 and amplifier 13. Each cell 2 also includes two X-Y planar ungrounded armatures or ungrounded metal capacitor plates 23,24 that are of generally equal area and are horizontally or X-direction spaced from each other within the common X-Y horizontal plane. A thin dielectric layer 25, or a thin passivation layer 25, covers the upper surface of capacitor plates 23,24, and the upper horizontal surface 125 of layer 25 provides an active array surface for physical contact by the ungrounded skin surface 18 of a person's fingertip whose fingerprint pattern is to be sensed or determined. Dielectric layer 25 may cover the entire face of the upper portion of IC device 1 that includes array 3 and its individual cells 2.

In use, a person's ungrounded fingertip 18 is placed on the upper surface 125 of array 3's dielectric layer 25. Fingertip skin surface 18 thereby forms an ungrounded armature or ungrounded electrode (also see 133 of FIG. 3) that vertically overlies and faces the top X-Y planar surface of ungrounded capacitor plates 23,24. As shown in FIG. 3, ungrounded skin surface 18 operates to define with plates 23,24 a first capacitor 34 and a second capacitor 33, which series connected compound capacitor 33,34 is connected in negative feedback fashion from ungrounded amplifier output 17 to ungrounded amplifier input 16.

Each cell 2 also includes a normally open reset, control, or start switch 19, preferably in the form of a MOS switch. Switch 19 selectively and momentarily operates to short ungrounded amplifier input 16 to ungrounded amplifier output 17. Switch 19 is controlled by a control signal "R" that is provided by FIG. 1's supply and logic unit 7. At the start of a fingerprint acquisition operation, switches 19 of all array cells 2 are momentarily closed, and the input/output voltage level at all cell inputs 21 is thus maintained at a constant magnitude. In this way, input voltage 21 of all cells 2 is brought to the same potential as the cell's output voltage 17.

Shortly thereafter, supply and logic unit 7 operates to open all reset switches 19, and to supply all ungrounded cell inputs 21 with a step voltage that is equal in magnitude to reference voltage Vr relative to system ground 100. An electrical charge is now induced at each of the cell input capacitors 20, thus permitting the reading of the local and individual Z-direction cell distances "d" that exist between a cell's ungrounded capacitor plates 23,24 and that cell's overlying and ungrounded skin surface 18.

Scanning stages 5,6 of FIG. 1 now operate to sequentially enable the reading or interrogation of the many cells 2 within array 3. In this way, buffer 8 operates to sequentially provide a serial signal output 10 in the form of a sequence gray levels of voltage that provide a three-dimensional readout and display of the skin surface 18 of the fingertip that is currently resident on the top dielectric surface 125 of array 3.

FIG. 3 is an equivalent circuit of the single cell circuit shown in FIG. 2. The input capacitance of amplifier 13 is shown at 30, the output capacitance of amplifier 13 is shown at 31, system ground potential is shown at 100, and the two above-mentioned series connected and skin-sensitive capacitors are shown at 133,33,34.

In this type of capacitance sensing array 3, wherein each cell's amplifier configuration (see FIG. 2) includes the ungrounded output 17 to input 16 feedback circuit that includes elements 23,25,18,25,24, a high electrostatic potential that is sometimes carried by the human body may cause fingertip 18 to produce undesirable and potentially circuit-destructive voltages to be induced at amplifier circuit modes such as 16 and 17.

With reference to the side view of FIG. 4 and the top view of FIG. 5, the present invention provides a grounded metal grid or mesh construction and arrangement 40 that is electrically isolated from, but physically associated with, each of FIG. 2's capacitor plates 23 and 24 that are buried within, or are located under, dielectric layer 25. While it is preferred that both capacitor plates 23,24 and grid/mesh 40 be buried within the body of dielectric layer 25, as is shown in FIGS. 4 and 5, within the spirit and scope of this invention one or both of the two components capacitor plates 23,24 and grid/mesh 40 may be carried by the bottom surface 225 of dielectric layer 25, as is shown in FIG. 2. In addition, within the spirit and scope of this invention, the two components capacitor plates 23,24 and grid/mesh 40 may be located in a common horizontal or X-Y plane, or they may be located in different horizontal planes. When located in different horizontal planes, it is preferred, but not essential, that the plane of grid/mesh 40 be located closer to dielectric surface 125 than are capacitor plates 23,24, as is shown by dotted line 325 of FIG. 4.

It is important to this invention that both capacitor plates 23,24 and electrically grounded grid/mesh 40 be physically located vertically under the upper surface 125 of dielectric layer. In this way, grid/mesh 40 is physically and electrically isolated from the upper surface 125 of the dielectric layer 25 upon which ungrounded fingertip 18 is placed during acquisition of its fingerprint pattern.

In FIG. 4, grounded grid/mesh 40 is shown associated with only one FIG. 2 cell. However, in a like manner, grounded metal grid/mesh 40 is associated with each of the cells 2 of FIG. 1, as better shown by the top view of FIG. 5. Grid/mesh 40 operates to protect all ungrounded amplifier modes of all sensing cells 2 from any electrostatic potential that may be carried by a person whose fingerprint is to be sensed or detected by way of placing the fingertip portion 18 physically on, or closely adjacent to, the top surface 125 of dielectric layer 25.

As seen in FIG. 5, each capacitor plate is surrounded by a dielectric-defined gap area 41 that comprises a portion of dielectric layer 25. By way of example, the width 41 of gap area is usually equal to a few microinches.

Figure 6:
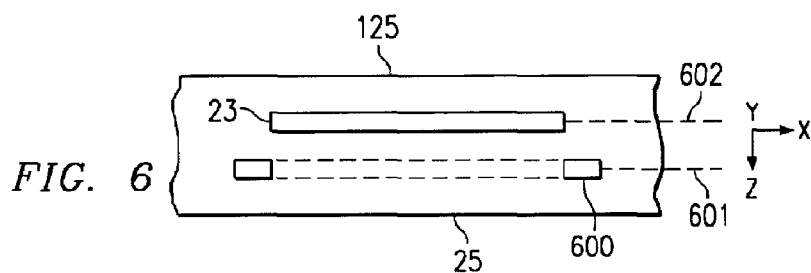
FIG. 6 is a side view similar to FIG. 4 that shows an embodiment of the invention having a grounded metal-pattern that occupies a generally horizontal plane that is located vertically below the horizontal plane occupied by the capacitor plate(s) to be protected from electrostatic charge.

FIG. 6 is a side view similar to FIG. 4 that shows an embodiment of the invention having a grounded metal-pattern 600 that occupies a generally horizontal plane 601 that is located vertically below the horizontal-plane 602 that is occupied by one or more capacitor plates 23 that are to be protected from an electrostatic charge that may be carried by a finger resident on horizontal dielectric surface 125.

Figure 7:
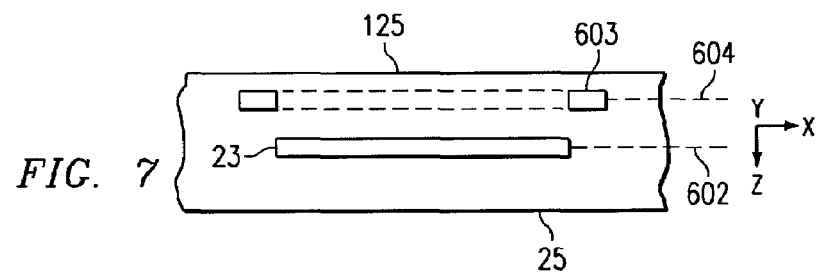
FIG. 7 is a side view similar to FIG. 6 that shows an embodiment of the invention having a grounded metal-pattern that occupies a generally horizontal plane that is located vertically above the horizontal plane occupied by the capacitor plate(s) to be protected from electrostatic charge.

FIG. 7 is a side view similar to FIG. 6 that shows an embodiment of the invention having a grounded metal-pattern 603 that occupies a generally horizontal plane 604 that is located vertically above the horizontal plane 602 that is occupied by one or more capacitor plates 23 to be protected from electrostatic charge that may be carried by a finger that is resident on horizontal dielectric surface 125.

Figure 8:
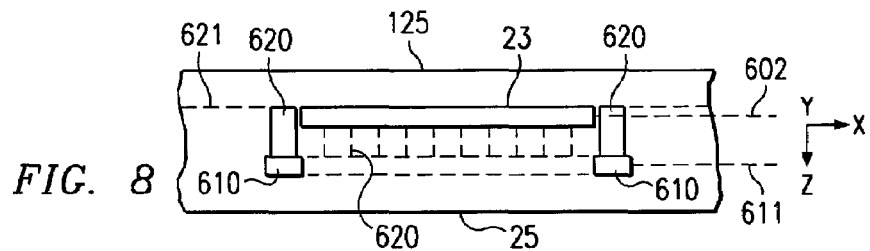
FIG. 8 is a side view similar to FIG. 7 that shows an embodiment of the invention having a grounded metal-pattern that occupies a horizontal plane that is located vertically below the horizontal plane occupied by the capacitor plate(s) to be protected from electrostatic charge, this metal-pattern including a plurality of metal fingers that extend vertically upward to generally surround the capacitor plate(s) to be protected from electrostatic charge.

FIG. 8 is a side view similar to FIG. 7 that shows an embodiment of the invention having a grounded metal-pattern 610 that occupies a horizontal plane 611 that is located vertically below the horizontal plane 602 that is occupied by one or more capacitor plates 23 that are to be protected from electrostatic charge that may be carried by a finger that is placed on horizontal dielectric surface 125. In this embodiment, metal-pattern 610 includes a plurality of metal fingers 620 that extend vertically upward to generally surround a capacitor plate 23 that is to be protected from electrostatic charge that may be carried by a finger that is placed on horizontal dielectric surface 125. In FIG. 8, it is shown that the upper ends of fingers 620 terminate in a plane 621 that is generally coincident with the upper surface of capacitor plate(s) 23, much as is shown in FIG. 4. However, it is to be noted that the upper ends of fingers 620 may also be located below capacitor plate(s) 23, as in FIG. 6, or the upper ends of fingers 629 may be located above capacitor plate(s) 23, as in FIG. 7.

FIG. 8 is also of interest to the general scope of this invention in that this embodiment shows that within the spirit and scope of this invention a capacitor plate protecting metal-pattern need not provide continuous encirclement of the capacitor plate that is to be protected from finger-carried electrostatic voltages.

This invention has been described in detail while making reference to preferred embodiments thereof. However, since it is appreciated that those skilled in the art will, upon learning of this invention, readily visualize yet other embodiments of this invention that are also within its spirit and scope, it is not intended that the above detailed description be taken as a limitation on the spirit and scope of this invention.

What is claimed is:

1. A method of providing electrostatic discharge for a capacitive fingerprint pattern detecting array, comprising:

providing a fingerprint pattern detecting array having a number of individual skin-distance sensing cells that are arranged in a closely spaced physical configuration;

providing a dielectric layer for said array, said dielectric layer having an upper surface and a lower surface;

placing a fingertip having a fingerprint pattern on said upper surface;

providing each sensing cell with an amplifier having an ungrounded input node and an ungrounded output node;

providing an ungrounded feedback signal from the output node to the input node for each of said amplifiers, said signal feedback being modified according to a skin distance within said fingerprint pattern;

providing said feedback for each of said amplifiers by way of (1) a first capacitor plate that is placed vertically under said upper surface or said dielectric layer and is connected to said ungrounded input node, (2) a second capacitor plate that is placed vertically under said upper surface of said dielectric layer in close horizontal spatial relation to said first capacitor plate and is connected to said ungrounded output node, and (3) said fingertip in vertical spatial relation with said first and second capacitor plates;

providing a metal path to at least partially spatially surround but not physically engage said first and second capacitor plates; and connecting said metal path to ground and to thereby protect said input and output nodes from electrostatic potential that may be carried by said fingertip by providing an electrostatic discharge path for said electrostatic potential.

2. The method of claim 1 further comprising:

forming said first capacitor plate, said second capacitor plate, and said metal path within said dielectric layer at a location that is spaced from said upper surface of said dielectric layer.

3. The method of claim 1, further comprising:
placing said first and second capacitor plates and said metal path on a common physical plane.

4. The method of claim 1, further comprising:
providing said amplifier for each sensing cell as signal-inverting amplifier; and
providing said ungrounded feedback for each of said amplifiers as negative feedback signal.

5. The method of claim 1, further comprising:
prior to said step of placing said ungrounded fingertip on said upper surface, momentarily shorting said input and output nodes of each amplifier of each sensing cell.

6. The method of claim 5, further comprising:
providing said amplifier for each sensing cell as signal-inverting amplifier; and
providing said ungrounded feedback for each of said amplifiers as negative feedback.

* * * * *